(12) United States Patent
Lin et al.

(10) Patent No.: US 6,286,422 B1
(45) Date of Patent: Sep. 11, 2001

(54) METHOD AND APPARATUS FOR DISPENSING VISCOUS MATERIAL

(75) Inventors: Jeff (Jin Her) Lin, Canton; John Trublowski, Troy; Vinh Van Ha, Southfield, all of MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 0 days.

(21) Appl. No.: 09/359,617

(22) Filed: Jul. 22, 1999

Related U.S. Application Data

(63) Continuation-in-part of application No. 08/716,037, filed on Sep. 19, 1996, which is a continuation of application No. 08/363,806, filed on Dec. 27, 1994, now abandoned.

(51) Int. Cl.$^7$ ..................................................... B41F 15/44
(52) U.S. Cl. ........................ 101/123; 101/120; 101/124; 118/413
(58) Field of Search ................................ 101/119, 120, 101/123, 124, 129, 167, 169; 118/406, 410, 413; 427/282

(56) References Cited

U.S. PATENT DOCUMENTS

| | | | |
|---|---|---|---|
| 3,384,931 | * 5/1968 | Cochran et al. ................ 101/123 |
| 3,994,220 | * 11/1976 | Vertegaal ....................... 101/120 |
| 4,023,486 | * 5/1977 | Linthicum et al. ............. 101/123 |
| 4,076,864 | * 2/1978 | Wallsten ......................... 118/413 |
| 4,510,863 | * 4/1985 | Blaak et al. .................... 101/119 |
| 4,538,518 | * 9/1985 | Dahlgren ........................ 101/169 |
| 4,622,239 | 11/1986 | Schoenthaler et al. ......... 118/410 |
| 4,720,402 | 1/1988 | Wojcik ........................... 427/282 |
| 5,133,120 | 7/1992 | Kawakami et al. ............. 29/852 |
| 5,191,709 | 3/1993 | Kawakami et al. ............. 29/852 |
| 5,452,655 | * 9/1995 | Tani ................................ 101/123 |
| 5,802,970 | * 9/1998 | Tani ................................ 101/123 |

FOREIGN PATENT DOCUMENTS

| | | | |
|---|---|---|---|
| 2302084 | * 7/1974 | (DE) ............................ 101/120 |
| 81476 | * 6/1983 | (EP) ............................. 101/120 |
| 285217 | * 10/1988 | (EP) ............................. 101/120 |

* cited by examiner

*Primary Examiner*—Stephen R. Funk
(74) *Attorney, Agent, or Firm*—Visteon GlobalTech.

(57) ABSTRACT

A novel apparatus for compressing viscous material through openings in a stencil is disclosed. The novel apparatus has a compression head cap which provides a contained environment to direct and to aid the flow of pressurized viscous material through the openings in the stencil.

11 Claims, 12 Drawing Sheets

METHOD AND APPARATUS FOR DISPENSING VISCOUS MATERIAL

This application is a continuation in part from pending U.S. patent application Ser. No. 08/716,037 (filed Sep. 19, 1996), which is a continuation of U.S. patent application Ser. No. 08/363,806 (filed Dec. 27, 1994, and now abandoned).

BACKGROUND OF THE INVENTION

1. Field of the Invention

Embodiments of the present invention relate generally to methods and devices for depositing viscous materials onto a printed wiring board. In one aspect, the present invention relates to methods and devices for compressing viscous materials, such as solder paste, through openings in a perforated substrate, such as a patterned screen or stencil.

2. Description of Related Art

Surface Mount Technology (SMT) involves placing circuit components onto circuit paths embedded on the upper surface of a printed wiring board and then soldering the components in place by a process called "reflow soldering". Before the circuit component is placed on the printed wiring board, however, it is desirable to apply solder paste to the area on the printed wiring board where the component is to be soldered into place.

Conventional methods do exist to deposit ("print") solder paste onto desired areas of a printed wiring board by forcing the paste through openings in a substrate (e.g., a stencil) placed in intimate contact with the printed wiring board.

U.S. Pat. No. 4,622,239 describes such a method and device for dispensing viscous materials. The method includes forcing a viscous material from a housing through an opening and depositing it onto a stencil between a pair of flexible members (parallel squeegee blades) which depend from the housing on either side of the opening and are in contact with the stencil. The ends of the flexible members are not connected and remain open ended. The viscous material, accordingly, is not contained within an enclosed area when it is deposited on the surface of the stencil. Movement of the housing and the flexible members horizontally across the stencil causes the trailing flexible member to force the viscous material through the openings in the stencil. U.S. Pat. No. 4,720,402 describes a similar method and device except that the leading flexible member is raised off of the stencil during movement of the housing.

U.S. Pat. Nos. 5,133,120 and 5,191,709 describe methods for filling through-holes of a printed wiring board via a mask with pressurized conductive filler material by means of a nozzle assembly unit having a nozzle tip member. The nozzle tip member, however, is designed only to dispense the pressurized conductive filler material through the mask to a single through-hole. The nozzle tip member then "scans" the printed wiring board for a second through-hole to fill. The nozzle tip member has a blunt end section which rests on the mask and a circular exit, the diameter of which may be increased or decreased by changing the nozzle tip member. The nozzle tip member dispenses the filler material without controlling unwanted flow of "excessive" filler material back through the stencil. Additionally, the nozzle tip member does not define a contained environment where "compression" of the filler material takes place through the mask followed by the immediate shearing off of the filler material within that contained environment from the surface of the stencil. In fact, the nozzle tip member itself provides no effective means for shearing off filler material from the top of the stencil, rather, after the through hole is filled and filler material "backs up" through the stencil, the nozzle tip member moves forward whereupon the "excessive" filler material is then wiped off by a separate, single, flexible squeegee member which is designed for unidirectional use only.

Unfortunately, these conventional efforts do not provide a contained environment for compression of viscous material through holes in a stencil and shearing of viscous material within the contained environment from the upper surface of the stencil. Reliance upon squeegee movement to force the viscous material, such as solder paste, through the stencil openings can lead to damage and eventual failure of both the squeegee blades and the stencil due to repeated friction. Since conventional efforts do not provide a contained environment in which compression and shearing is accomplished, waste of the viscous material is frequently encountered.

Conventional efforts, therefore, (1) fail to maximize the efficiency of printing solder paste onto a desired area of a printed wiring board and (2) fail to minimize waste of the solder paste during the printing process. A need therefore exists to develop a method for printing solder paste onto a printed wiring board and a device suitable for use therewith which overcomes the deficiencies of the conventional efforts.

Other prior viscous material dispensers utilizing compression print heads suffer from several drawbacks associated with the shearing blades utilized by the compression head. Particularly, the substantially rigid and non-compliant shearing blades do not readily maintain their respective intimate and sealing contact with the stencil, thereby causing undesirable paste leakage as the blades move away from contact with the stencil surface. Moreover, these prior blades do not readily conform to stencil surface variations, oftentimes damaging the stencil as they traverse over the stencil surface.

Another drawback associated with these prior dispenser assemblies is their respective use of relatively large and heavy disposable paste syringes or viscous material reservoirs, which are typically mounted upon the compression head, and which force the contained viscous material or the paste from the syringes to the distribution chamber of the compression head. These large syringes and dispensers are very difficult to service and replace, adversely affect the maneuverability of the compression head assembly, and require relatively costly and undesired structural modifications to the head assembly in order to properly strengthen the assembly. Furthermore, the supported reservoirs/dispensers need to be frequently replaced and/or filled, thereby requiring an interruption in the printing process and prolonging production time and decreasing production efficiency. The use of even larger syringes and dispensers reduces the frequency of replacement but further increases the probability of compression head structural damage, further adversely impacts the maneuverability of the compression head, and further complicates the required assembly maintenance operation.

The present invention is therefore also directed at substantially eliminating and/or decreasing material leakage and damage to the stencil by providing substantially self-compliant shearing blades which are selectively and flexibly moveable in response to variations and/or incidental changes in the pressure and surface variations of the stencil. The present invention is further directed to the use of relatively large viscous material reservoirs in a manner which substantially overcomes the previously-delineated drawbacks.

SUMMARY OF THE INVENTION

The present invention includes a novel apparatus and method for dispensing viscous material through openings in a stencil. Embodiments of the present invention include a process herein referred to as "compression printing" wherein pressure is applied to a viscous material within a contained environment defined by a compression head cap so as to compress it through openings in a stencil.

The apparatus of the present invention includes a reservoir containing viscous material which is operably connected to a pressure source. The reservoir is in fluid communication with a housing which terminates in a substantially uniform opening defined by a compression head cap formed from contiguous walls. During operation of the apparatus, the compression head cap is placed in contact with a stencil having a plurality of openings therein. The compression head cap and the stencil form a contained environment. The pressure source then applies pressure against the viscous material contained in the reservoir forcing it from the reservoir into the housing and to the compression head cap. The contiguous walls of the compression head cap act to contain and to direct flow of the pressurized viscous material to the top surface of the stencil and then through the openings in the stencil.

It is accordingly an object of the present invention to provide a novel apparatus for compressing a viscous material through openings in a stencil by means of a pressure source. It is a further object of the present invention to increase the efficiency of printing viscous material onto a desired area of a printed wiring board and to minimize waste of the viscous material during the printing process.

According to one aspect of the present invention, an apparatus is provided for selectively depositing viscous material upon a stencil. The apparatus includes a printer head formed by two members which cooperatively define an internal chamber which terminates in a bottom surface and which selectively receives and dispenses the viscous material. A pair of flexible self-compliant blades are each fixedly secured to the bottom surface and are adapted to selectively engage the stencil and flexibly move across the stencil, effective to desirably spread the selectively deposited viscous material across the stencil.

According to yet another aspect of the present invention, an apparatus for selectively dispensing viscous material is provided. The apparatus includes a moveable print head which dispenses the viscous material; and an independently supported dispenser containing viscous material. A tube is provided and connects the dispenser to the print head, thereby communicatively coupling the viscous material from the dispenser to the print head.

Other objects, features or advantages of the present invention will become apparent from the following description taken in conjunction with the accompanying drawings.

BRIEF DESCRIPTION OF THE DRAWINGS

In the course of the detailed description of certain preferred embodiments to follow, reference will be made to the attached drawings, in which.

DESCRIPTION OF CERTAIN PREFERRED EMBODIMENTS

The principles of the present invention may be applied with particular advantage to obtain an apparatus for compressing a viscous material through openings in a stencil, preferred embodiments of which may be seen at FIGS. 1, 2, 3, 4, and 5 which are described more fully below.

Figure 1:
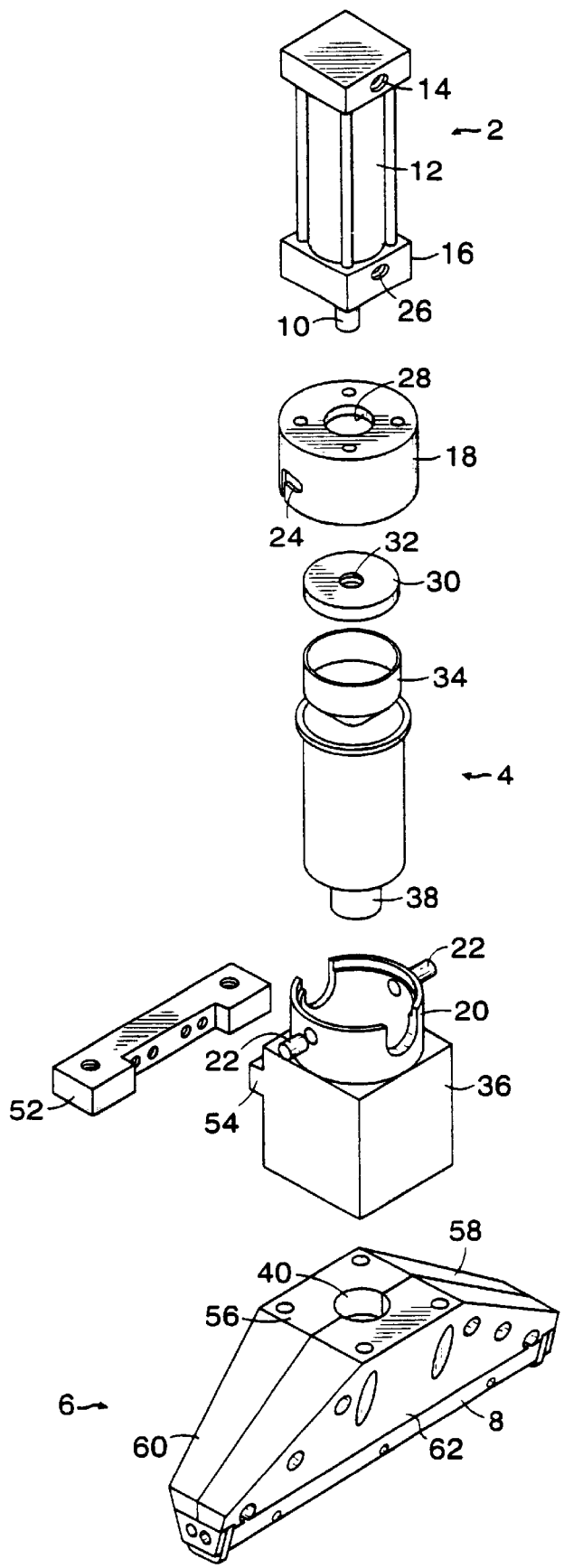
FIG. 1 is a perspective view of the apparatus of the present invention, partially exploded.

FIG. 1 is a partially exploded perspective view of one embodiment of the apparatus of the present invention. As can be generally seen at FIG. 1, the apparatus has a pressure source 2 which is operably connected to a reservoir 4 containing a supply of a viscous material, a compression head 6 and a compression head cap 8.

More particularly, FIG. 1 shows a pressure source depicted as an air cylinder 2 having a piston (not shown) connected to a rod 10 contained in a cylinder housing 12. Pressure inlet 14 allows for the introduction of air pressure at the top of air cylinder 2 thereby displacing the piston causing piston rod 10 to move downward. The air cylinder 2 is mounted via base 16 to cylinder mount 18 which in turn is removably mounted to casing 20 via a twist socket connector having posts 22 and socket grooves, one of which is shown at 24. Base 16 has air inlet 26 for the introduction of air pressure at the bottom of air cylinder 2 thereby displacing the piston causing piston rod 10 to move upward.

Piston rod 10 extends through opening 28 of cylinder mount 18 and is fixedly connected to syringe pusher 30 at contact 32 which in turn engages displacement piece 34 which is movably disposed within syringe 4 which contains a viscous material. Displacement piece 34 acts as a plunger and is designed to mate with the interior of syringe 4 to ensure effective displacement of viscous material with minimal waste. Pressure source 2 is designed to mechanically meter out viscous material through operation of the syringe pusher 30 on the displacement piece 34. The syringe pusher 30, displacement piece 34 and syringe 4 are all vertically housed in operative fashion within the cylinder mount 18, the casing 20 and the syringe housing 36.

The vertical arrangement of the pressure source 2 and the syringe 4 containing the viscous material is a preferred arrangement which advantageously provides for even and direct pressure in metering out the viscous material onto the top surface of a stencil. It is to be understood that pressure source 2 is not limited to an air cylinder of the type depicted in FIG. 1, but that other suitable pressure sources may be used by one of ordinary skill in the art based upon the teachings of the present invention. Such pressure sources include those which mechanically, electrically, or hydraulically operate a mechanical force, such as a piston rod and displacement piece, to meter out viscous material from a syringe housing or other reservoir which contains viscous material. In addition, pneumatic pressure may be used directly to force viscous material from a reservoir housing. Also, pressure source and reservoir configurations other than the vertical configuration depicted in FIG. 1 are useful in the present invention. Such configurations include side mounted reservoirs and pressure sources or other configurations readily known to those skilled in the art.

The syringe 4 is preferably a disposable unit which can be replaced when desired by disconnecting cylinder mount 18 from casing 20 via the twist socket connector, removing the syringe and replacing it with an alternate syringe. Examples of disposable syringes useful within the teachings of the present invention include those which are readily commercially available from Methods Engineering, Vauxhall, N.J. The cartridges may be purchased prefilled with suitable viscous materials or they may be purchased empty and then filled with suitable viscous materials, such as solder pastes, which are useful within the practice of the present invention. Useful solder pastes may be readily commercially available from Alpha Metals, Jersey City, N.J.

Typical solder pastes useful with surface mount technology generally contain an alloy of tin, lead and silver in various proportions in combination with other useful solder paste metals, viscosity agents, flux and/or solvents depending upon the desired use of the solder paste. Solder pastes useful in the present invention will become apparent to one of ordinary skill in the art based upon the teachings herein.

Figure 2:
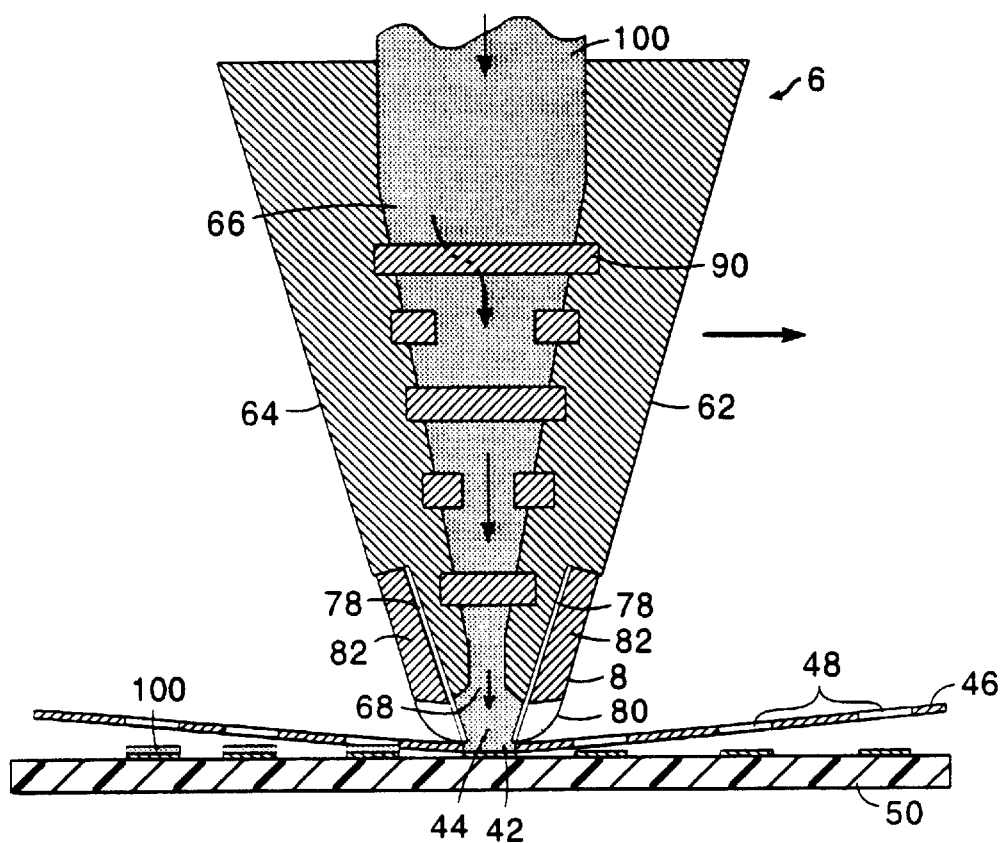
FIG. 2 is a side cross-sectional view of a compression head, a compression head cap, a stencil and a printed wiring board of the present invention showing movement of the solder paste through the compression head, the compression head cap and the openings of the stencil onto the printed wiring board.

The syringe housing 36 is mounted to a housing referred to herein as a compression head generally depicted at 6 in FIG. 1 and shown in a cross-sectional side view in FIG. 2. The syringe 4 has flange opening 38 which is inserted into and mates with first opening 40 of compression head 6 which is described hereafter with reference to both FIGS. 1 and 2 and FIG. 3 which is a bottom perspective view of the compression head cap 8, partially broken away. The compression head 6 terminates in a substantially uniform second opening 42 which is defined by compression head cap 8. The compression head cap 8 is formed from contiguous walls which define a volume 44 within compression head cap 8. The contiguous walls may be either unitary or formed from separate elements and are designed to contact stencil 46 to provide a uniform and substantially flush union with stencil 46 at the point of contact. As can be seen in FIG. 2, stencil 46 has openings 48 and is placed in an operable relationship with a printed wiring board 50. The stencil 46 may be placed in intimate contact with printed wiring board 50 or, as shown in FIG. 2, it may be placed a distance above printed wiring board 50 such that pressure from the compression head 6 forces the stencil 46 into contact with printed wiring board 50. Although stencil 46 is shown in cross-section, it is to be understood that openings 48 may have any desired orientation on stencil 46. Further openings 48 may differ in size depending upon the area of the printed wiring board 50 to be printed with the viscous material. The compression head cap 8 and stencil 46 together form a contained environment 44 for the viscous material during operation of the apparatus of the present invention.

The compression head 6 is preferably formed from metal, such as iron or stainless steel or other material suitable for use with pressurized viscous material. The compression head 6 has top surface 56 which serves as the base to which the syringe housing 36 is attached. Side surfaces 58 and 60 extending from top surface 56 slope away from each other as depicted in FIG. 1 to define an increasing length of compression head 6. Front and back surfaces 62 and 64 are contiguous with side surfaces 58 and 60 and slope toward each other as depicted in FIG. 2 to define a decreasing width of compression head 6. The side surfaces join with the front and back surfaces to define a tapered interior chamber 66 as shown in FIG. 2 which acts to restrict from of viscous material through compression head 6. Interior chamber 66 terminates in generally rectangular exit 68. The compression head cap 8 defines a volume 44 surrounding the rectangular exit 68 and into which viscous material flows after exiting the interior chamber 66 of compression head 6. As shown in FIG. 2, the volume 44 is preferably a separate chamber into which the viscous material flows after exiting the interior chamber 66 via rectangular exit 68. The compression head cap 8 defines a generally rectangular opening 42 which is to be contacted with stencil 46. The compression head cap 8 acts to contain and direct the flow of viscous material to the stencil 46. In an alternate embodiment, it is to be understood that the interior chamber 66 may terminate directly into compression head cap 8 without the need for rectangular exit 68 or volume 44.

Figure 3:
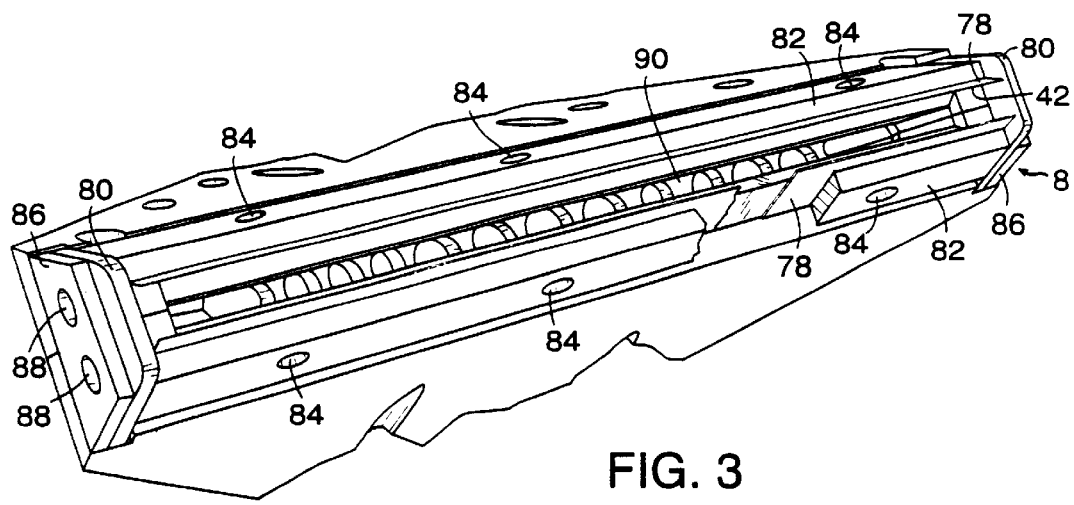
FIG. 3 is a bottom perspective view of the compression head cap of the present invention, partially broken away.
Figure 4:
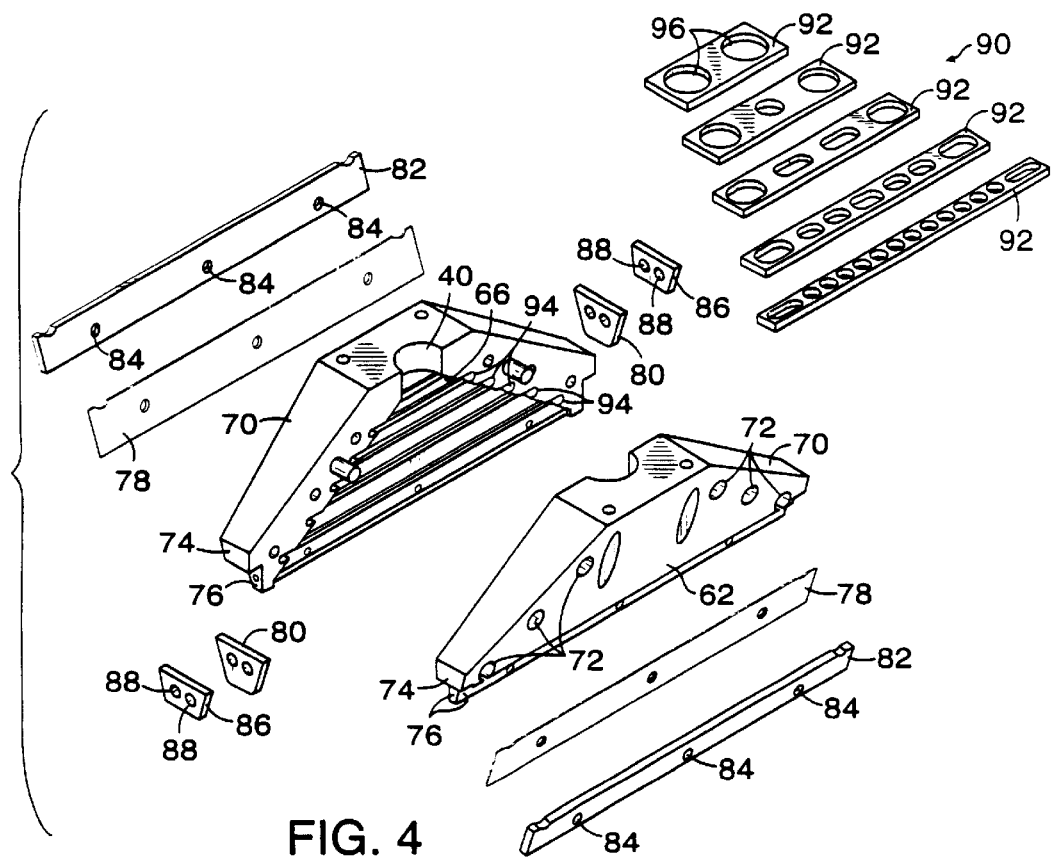
FIG. 4 is an exploded perspective view of the compression head of the present invention showing components of the compression head cap and one embodiment of a diffuser of the present invention.

As can be seen in FIG. 4, the compression head 6 has two half sections 70 which are fixedly connected by screws (not shown) via screw holes 72. The bottom side section 74 of each half section 70 is provided with ledge area 76 to engage the compression head cap 8. As depicted in FIGS. 2, 3 and 4, compression head cap 8 has rectangular blades 78 and end caps 80, which define generally rectangular opening 42. Blades 78 are each fixedly mounted to a corresponding ledge area 76 of front surface 62 and back surface 64, respectively, by means of corresponding rectangular blade holders 82 and screws (not shown) via screw holes 84. Blades 78 each extend along substantially the entire length of corresponding ledge area 76. End caps 80 are attached to a corresponding ledge area 76 of bottom side section 74 via corresponding cap mounts 86 and screws (not shown) via screw holes 88. The end caps 80 are contiguous with blades 78 and together form the compression head cap 8. As can be seen more clearly in FIG. 2, blades 78 parallel the slope of corresponding front and back surfaces 62 and 64, and are, therefore, seen to be angled inward relative to the interior chamber 66 of compression head 8.

Blades 78 are preferably thin and formed from rigid material such as iron or stainless steel. End caps 80 are preferably formed from a flexible substance such as polyurethane to avoid damage to the stencil during operation of the apparatus of the present invention. Cap mounts 86 and blade holders 82 are formed from any solid material capable of securing the corresponding end cap or blade.

While the compression head cap 8 is depicted in FIGS. 2, 3, and 4 as being formed from integral parts, it is to be understood that compression head caps having a unitary structure are within the teachings of the present invention. Such unitary compression head caps are formed from a single rectangular shaped unit and are designed to encircle the ledge area 76 of the compression head 6 or otherwise operatively engage compression head 6. Such compression head caps may be either fixed or removably mounted to the compression head and may have various sizes of opening 42.

The compression head 6 and compression head cap 8, in combination with the pressure source 2 and syringe 4 advantageously provide a vertical down force to move the viscous material evenly and directly to the stencil. The compression head cap 8 of the present invention advantageously provides a contained environment to direct and to aid in the extruding of pressurized viscous material through openings in the stencil. The extruded viscous material is then deposited on the pattern of the printed wiring board. The apparatus of the present invention provides for very high speed printing capability while maintaining print definition and reduced cycle time. Waste of viscous material is minimized due to the contained environment provided by the compression head cap 8. The length of the compression head cap 8 allows for simultaneous compression printing through a plurality of openings 48 in stencil 46. Furthermore, the trailing blade 78 relative to the direction of operation advantageously operates to shear off the viscous material contacting the stencil within the compression head cap 8 when the apparatus of the present invention is horizontally disposed across the stencil. The blades 78 are rigid and angled to advantageously achieve a smooth shearing of the viscous material. The compression head 6 and compression head cap 8 are advantageously rectangular in shape so that they may operate over a significant area of the stencil with each pass. Additionally, given the dual blade design of the compression head cap 8, the apparatus of the present invention may operate in both the forward and reverse directions thereby improving the efficiency of the compression printing process of the present invention.

As can be further seen in FIGS. 2 and 4, compression head 6 has diffuser 90 which is fixedly mounted within interior chamber 66. Diffuser 90 has a plurality of diffuser plates 92 which are horizontally disposed within interior chamber 66 via grooves 94. Each diffuser plate 92 has a series of openings 96 through which viscous material is to flow. Each opening 96 may be either circular or oblong and decreases in average size as the diffuser plates progress from the first opening 40 to the compression head cap 8. The openings 96 also increase in number as the diffuser plates progress from the first opening 40 to the compression head cap 8. The diffuser 90 advantageously serves to break up the flow of viscous material and evenly and uniformly distribute it from side to side of the rectangular exit 42. The diffuser 90 may also serve to reduce the velocity of the viscous material flowing through the compression head and increase the static pressure of the viscous material which aids in the compression printing process.

Figure 5:
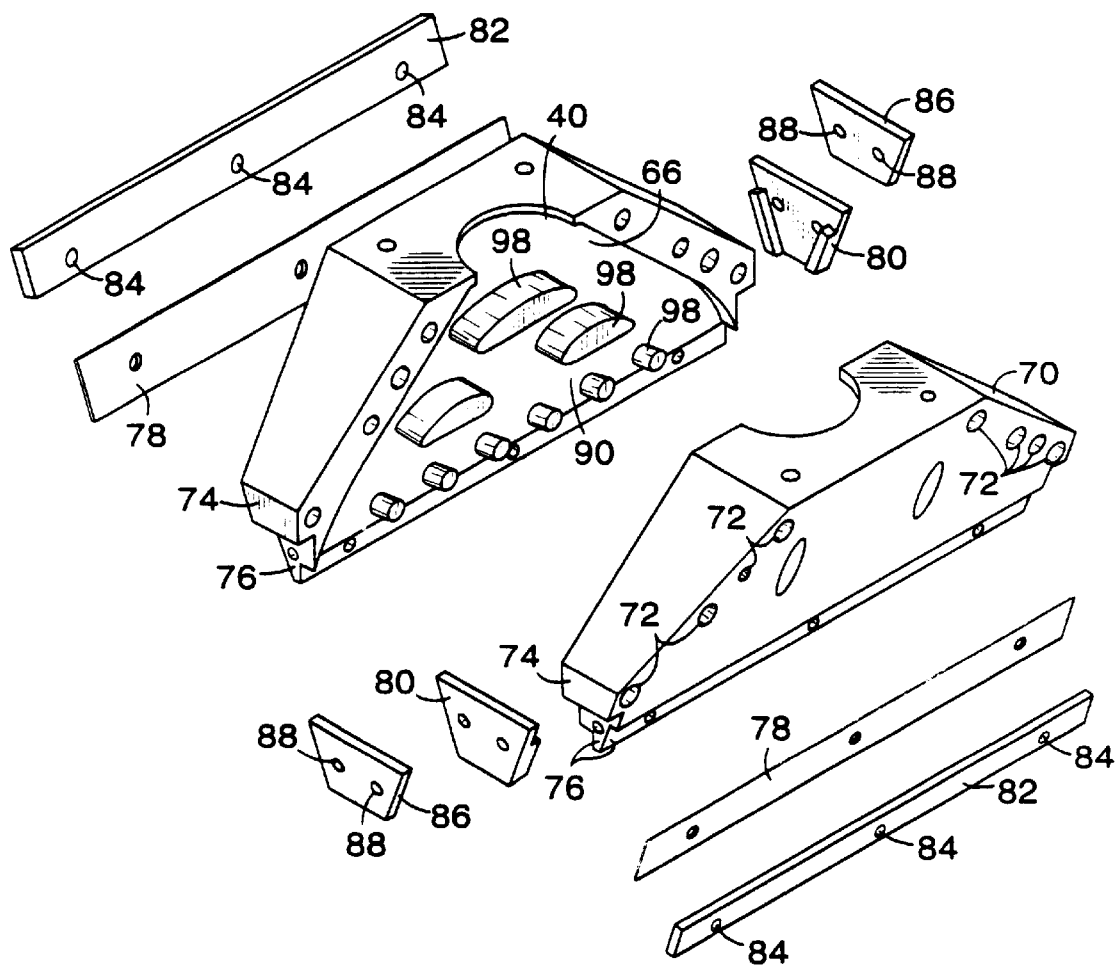
FIG. 5 is an exploded perspective view of the compression head of the present invention showing components of the compression head cap and a second embodiment of a diffuser of the present invention.
Figure 6:
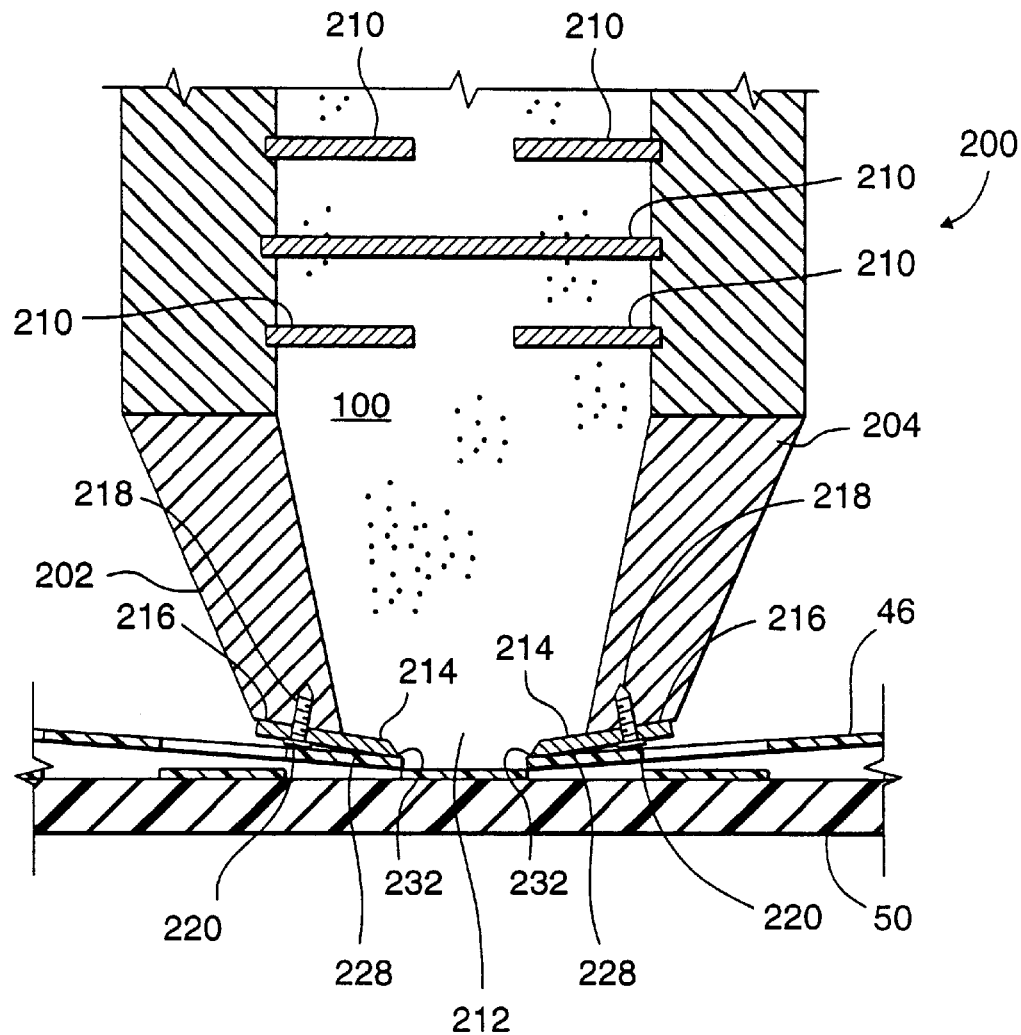
FIG. 6 is a fragmented side view of a print compression head assembly similar to that of FIG. 2 but made in accordance with a second embodiment of the invention.
Figure 7:
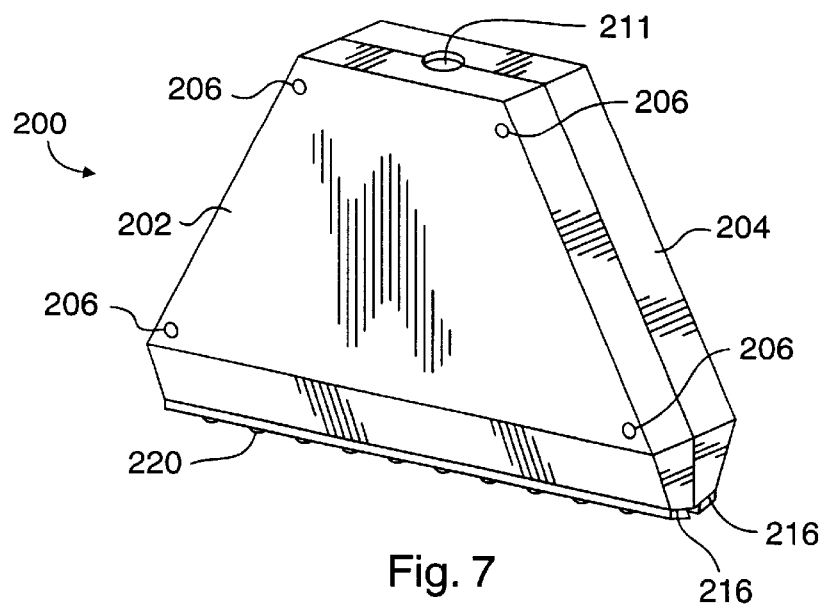
FIG. 7 is a front perspective view of the print compression head assembly shown in FIG. 6.

FIG. 5 shows an alternate embodiment of a diffuser 90 useful in the present invention. The diffuser 90 has a plurality of diffuser islands 98 which are horizontally disposed in rows within interior chamber 66. The diffuser islands 98 may be fixedly installed within the interior chamber 66 or they may be molded directly within the interior chamber 66. As with the diffuser 90 of FIG. 4, each diffuser island 98 acts to break up the flow of the viscous material and uniformly and evenly distribute it from side to side of rectangular exit 42. The diffuser islands may be either circular or oblong and decrease in average size as the rows progress from the first opening 40 to the compression head cap 8. The diffuser islands 98 also increase in number as the rows progress from the first opening 40 to the compression head cap 8. The diffuser islands 98 of the present invention are advantageous in that they provide for ease of fabrication of the compression head and ease of cleaning.

Operation of the apparatus of the present invention is now described as follows with reference to FIGS. 1 and 2. When compression printing according to the teachings of the present invention, the compression head cap 8 of the apparatus of the present invention is brought into contact with the top surface of stencil 46 which forces the stencil downward until it is in intimate contact with the printed wiring board below as shown in FIG. 2. The apparatus is then moved in a horizontal direction, as shown in FIG. 2, across the stencil 46.

During movement of the stencil, pressure source 2 acts on syringe 4 to force viscous material 100 from the syringe 4 into the interior chamber 66 of compression head 6 where it is diffused by diffuser 90 and directed to rectangular exit 68. The viscous material then enters volume 44 of compression head cap 8 which provides a contained environment via blades 78 and end caps 80 to direct the pressurized viscous material under pressure to the top surface of stencil 46. The viscous material is then extruded through openings 48 in the stencil 46 over which the compression head cap 8 travels. The extruded viscous material 100 is thereby printed on the printed wiring board 50. Movement of the compression head cap 8 across the stencil surface causes the trailing blade 78 which is angled inwardly relative to the interior chamber 66 to shear off the viscous material from the top surface of stencil 46. Once the apparatus has traversed the length of the stencil, the apparatus may simply reverse its direction and continue the compression printing process since the compression head cap 8 has dual blades 78 to accomplish the shearing process in either direction of movement.

Operating variables of the apparatus of the present invention, such as run speed and pressure, may be adjusted to accommodate either viscous materials having a wide range or viscosities or stencils with holes having a wide range of diameters. The following data in Table 1 is representative of the parameters at which the apparatus has successfully operated. Print speed is measured in inches per second, air pressure is measured in pounds per square inch, viscosity of the solder paste is measured in centipoises per second, stencil apertures are measured in inches, and the particle sizes of the solder pastes used are between 10–37 microns.

TABLE 1

| Print Speed (inches/sec.) | | Air Pressure | Viscosity (cps) | | Aperture (inches) | |
|---|---|---|---|---|---|---|
| Low | High | (psi) | Low | High | Low | High |
| 0.94 | 1.26 | 20 | 850K | 1.0M | 0.0055 | >0.025 |
| 1.45 | 1.70 | 20 | 850K | 1.0M | 0.0055 | >0.025 |
| 2.27 | 2.31 | 20 | 850K | 1.0M | 0.0055 | >0.025 |
| 3.10 | 3.89 | 30 | 850K | 1.0M | 0.0055 | >0.025 |
| 4.20 | 4.77 | 30 | 850K | 1.0M | 0.0055 | >0.025 |
| 5.98 | 6.62 | 40–50 | 850K | 1.0M | 0.0075 | >0.025 |
| 6.69 | 7.23 | 50–60 | 850K | 1.0M | 0.0075 | >0.025 |
| 7.70 | 12.00 | 50–60 | 850K | 1.0M | 0.0075 | >0.025 |

As indicated by the above data, the apparatus of the present invention has successfully operated over a wide range of print speeds, air pressures and stencil openings. The compression printing method disclosed herein advantageously provides for quicker print speeds, better quality of printing, and less waste of solder paste material than is encountered with conventional printing methods.

While the above-delineated invention provides significant improvement over prior dispensers and compression head assemblies, several drawbacks are associated with the shearing blades 78 utilized by the compression head 6 of the invention. More particularly, the substantially rigid and non-compliant shearing blades 78 do not readily maintain their respective intimate and sealing contact with the stencil, thereby causing undesirable viscous material or "paste" leakage to occur as the blades 78 "move away" from the stencil surface. Moreover, these blades 78 do not readily conform to stencil surface variations and oftentimes damage the stencil as they traverse over the stencil surface. These drawbacks were addressed, at least in part, by the compression heads described in U.S. Pat. No. 5,824,155, ("the '155 patent") which is fully and completely incorporated herein by reference, word for word and paragraph for paragraph and which is owned by Applicants' assignee.

Particularly, the compression heads of the '155 patent utilize a complementary "set" or pair of leaf springs which are operatively coupled to the blades 78 and which bias the blades 78 against the stencil surface while allowing the blades 78 to selectively and conformably traverse the stencil surface in order to uniformly and desirably "spread" the deposited viscous material over the stencil surface. While these springs adequately address these drawbacks for relatively short periods of time, they lose their compliance over time and require relatively frequent maintenance and replacement. Additionally, the viscous material or "solder paste" accumulates upon the "traveling region" of the blades 78 (e.g., the "region" or respective blade portions in selective contact with the stencil and those respective blade portions proximate to the blade contacting portions and which move or "travel" as the blades contact the stencil) where it dries and cumulatively causes a significant reduction in the spring compliance due, at least in part, to the increased weight of the blades and decreased shearing capacity of the blades.

Another drawback associated with these prior compression head assemblies is their respective use of relatively large and heavy disposable paste syringes or viscous material reservoirs, which are typically mounted upon the respective compression head assemblies, and which force the contained viscous material or the paste from the syringes to the distribution chamber of the compression head. These large syringes and dispensers are very difficult to service and replace, adversely effect the maneuverability of the compression head assembly, and potentially cause undesirable structural damage to the compression assembly. Furthermore, the supported reservoirs/dispensers need to be frequently replaced and/or filled, thereby requiring an interruption in the printing process, prolonging production time, and decreasing production efficiency. The use of even larger syringes reduces the frequency of replacement and interruption, but also undesirably require structural modification or "strengthening" of the compression head assembly, adversely impact the maneuverability of the compression head, and further complicate the required maintenance operation.

Referring now to FIGS. 6 through 11, there is shown a second embodiment of a compression head 200 for use with the present invention. Particularly, head 200 is formed by the selective attachment of two substantially identical members 202 and 204 which are each preferably manufactured from a relatively strong, rigid, and durable material such as stainless steel or some other suitable conventional and commercially available metal or composite. Members 202 and 204 are also selectively coupled by the use of commercially available and conventional fasteners 206 and may be further joined by conventional welding or other attachment processes.

Figure 8:
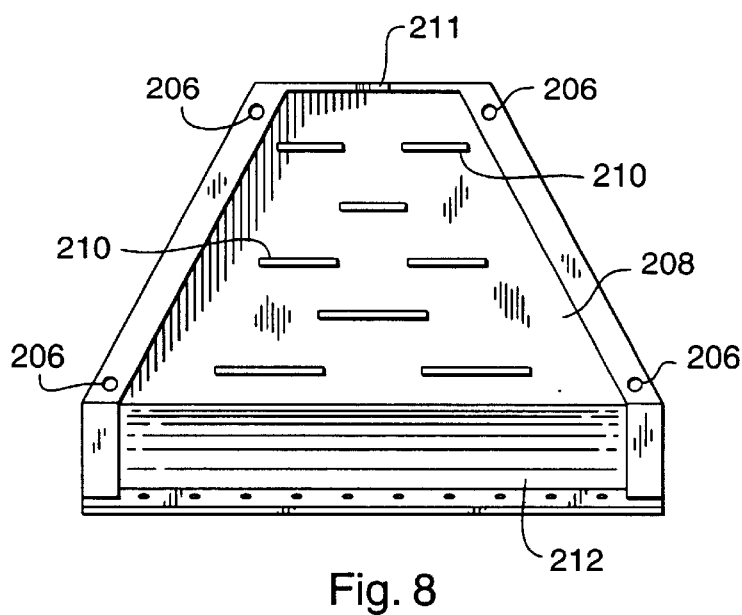
FIG. 8 is a front cut-away view of the print compression head assembly shown in FIG. 7.
Figure 9:
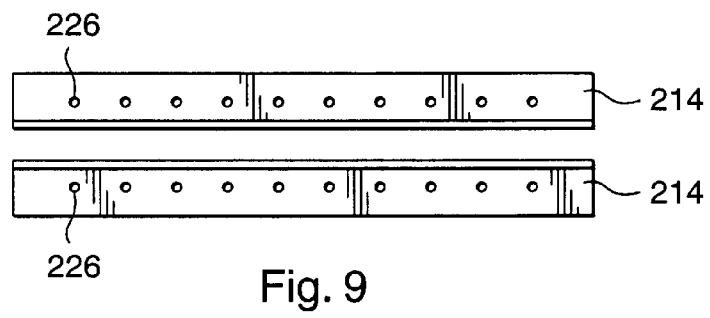
FIG. 9 is a top view of a pair of blades for use with the print compression head assembly shown in FIG. 6.

Members 202 and 204 cooperatively form at least one interior chamber 208 which, as shown best in FIG. 8, originates at a paste or viscous material reception input aperture 211 and gradually widens before terminating in a substantially rectangular elongated opening 212 which is generally and longitudinally coextensive to head 200 and which is substantially similar to the previously described opening 42. Chamber 208 further includes a plurality of diffuser islands 210 which, in one embodiment of the invention, are substantially identical in structure and function to the previously described diffuser islands 98 and which are horizontally disposed in several separate rows within chamber 208, in a manner which has been previously described with respect to islands 98.

Head 200 further forms substantially identical beveled blade support surfaces 216 which are longitudinally coextensive to opening 212 and which are respectively formed upon members 202, 204, thereby residing upon opposite sides of opening 212. Surfaces 216 include several substantially identical threaded apertures 218 which are each adapted to removably and securely receive a conventional and commercially available fastener 220.

Head 200 further includes two substantially identical, opposed, and relatively flexible and "self-compliant" blades 214, which are longitudinally coextensive to opening 212, each of which respectively and operatively residing upon a unique one of the surfaces 216. Blades 214 each have apertures 226 which cooperates with a unique one of the apertures 218 in order to allow the blades 214 to be selectively secured to the respective supporting surface 216 by use of fasteners 220. Blades 214, in one embodiment, are generally rectangular in shape, are manufactured from a relatively flexible and resilient commercially available metal or composite material and are inherently and characteristically flexible and compliant (ie., "self compliant"). Blades 214 each further include a generally flexible and moveable/compliant portion 228 which downwardly protrudes from one of the support surfaces 216 (e.g. towards the stencil 46) and which has a stencil contacting edge 232. In one non-limiting embodiment, edge 232 may be pointed or bevelled.

Figure 10:
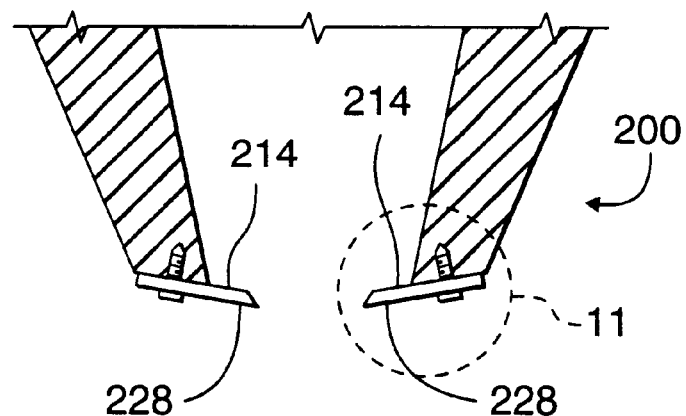
FIG. 10 is a fragmented side view of the compression head shown in FIGS. 6, 7 and 8 and employing blades made in accordance with the teachings of the preferred embodiment of the invention.
Figure 11:
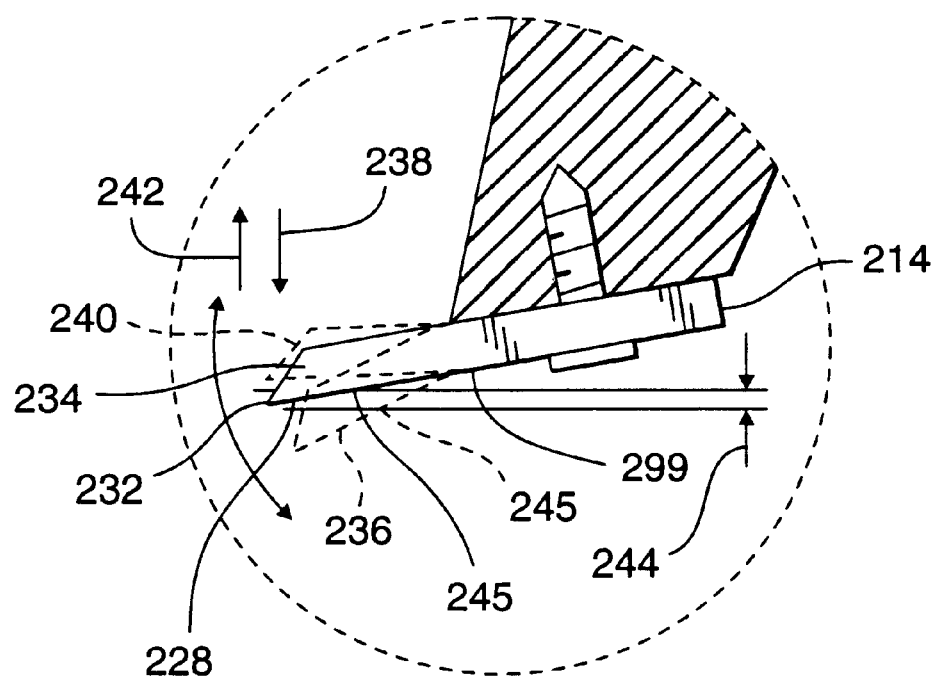
FIG. 11 is an exploded view of one of the blades shown in FIG. 9.

As illustrated best in FIGS. 10 and 11, blade projection or protruding portions 228 are selectively and flexibly moveable or deformable and may selectively occupy a first or initial "at rest" position 234; a second position 236 which is occupied in response to a "downward" type pressure or force, such as a force occurring in the general direction of arrow 238; and a third position 240 which is occupied in response to an "upward" type force such as a force in the general direction of arrow 242. Of course, portions 228 may also occupy other positions which typically occur between the illustrated positions 236 and 240. In one non-limiting embodiment, the amount of downward vertical deformation or deflection 244 of a point 245 located at about the middle of bottom edge 299 of portion 228, between position 234 and position 236, ranges from approximately one hundredth of an inch (0.010") to two hundredths of an inch (0.020"). A similar amount of travel exists between positions 234 and 240.

In operation, compression head 200 is placed upon a surface of a stencil, such as stencil 46, thereby compressibly forcing the stencil against the printed wiring board 50. Viscous material 100 is selectively introduced through aperture 211 and flows through the chamber 208 at a certain speed and pressure toward elongated opening 212. The viscous material 100 selectively engages the blades 214 which cooperatively constrict opening 212, thereby increasing the pressure of material 100 within the chamber 208.

As the pressure within chamber 208 increases, blades 214 generally flex or move outwardly against the stencil, typically between position 234 and position 236, thereby selectively, deformably, and sealingly engaging stencil 46. As head 200 moves across stencil 46, flexible blades 214 compliantly travel between these positions 234 and 236 in response to varying forces imposed upon blades 214 by variations in the surface of stencil 46 or by variations in the pressure of the deposited material 100, thereby substantially and shearingly causing the deposited material 100 to be uniformly spread across the stencil 46 while concomitantly preventing the deposited material 100 from leaking beyond or past the edges 232.

In this manner, the resiliency and compliancy of the operatively positioned blades 214 will cause projection portions 228 to substantially remain in sealing contact with stencil 46. The resiliency of blades 214 protects stencil 46 from damage caused by the incidental downward movement of head 200 during printing. That is, should head 200 move downward against stencil 46, blades 216 will flex "upward" toward position 240 and away from stencil 46, thereby substantially preventing damage to stencil 46 and to printing board 50.

Figure 12:
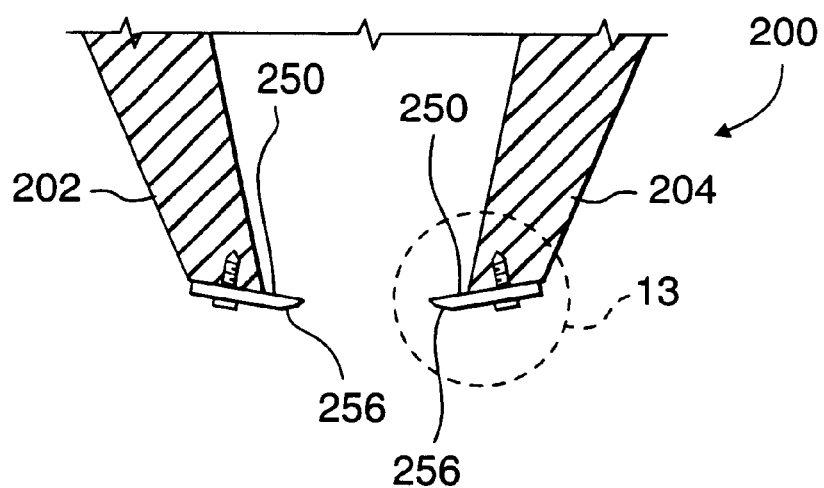
FIG. 12 is a fragmented side view of the compression head shown in FIGS. 6, 7, and 8 and employing blades made in accordance with an alternate embodiment of the invention.
Figure 13:
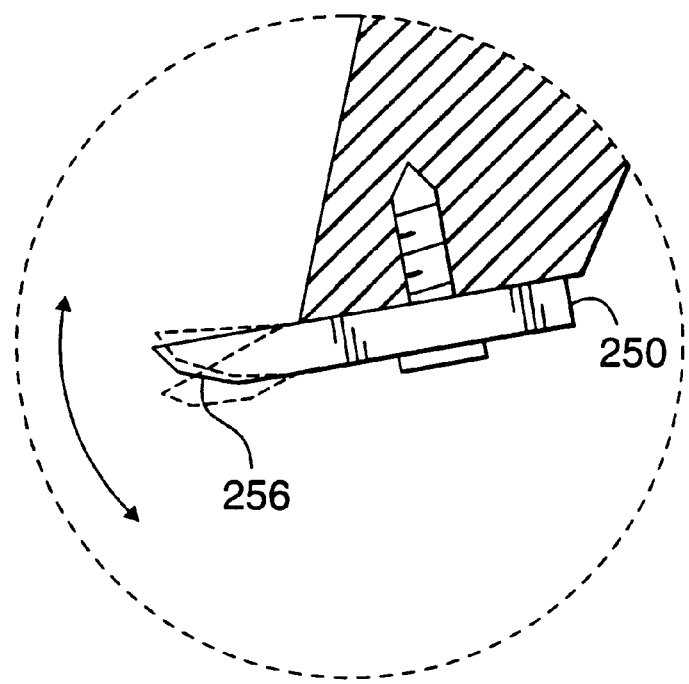
FIG. 13 is an exploded side view of one of the blades shown in FIG. 12.

Referring now to FIGS. 12 and 13, there is shown an alternative embodiment of a compression head 200, which is substantially identical in structure and function to compression head 200 except that the blades 214 have been replaced with blades 250. Particularly, blades 250 are substantially identical in structure and function to blades 214 except that blades 250 include a flexible or moveable and generally flat stencil contacting portion or surface 256. Unlike generally pointed stencil contacting edge 232, surface 256 provides a substantially flat or planar stencil contacting surface which provides further compliance with stencil 46, more efficient distribution of the material 100 upon stencil 46 and onto board 50, and better shearing of material 100 from the surface of stencil 46.

Figure 14:
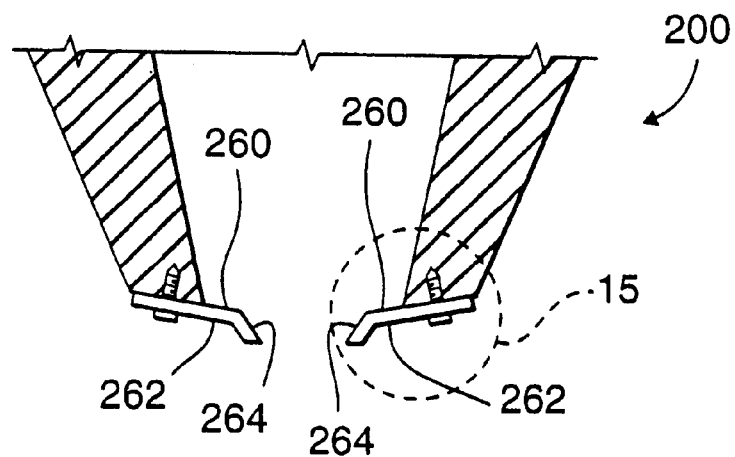
FIG. 14 is a fragmented side view of the compression head shown in FIGS. 6, 7, 8 and employing blades which are made in accordance with yet another embodiment of the invention.
Figure 15:
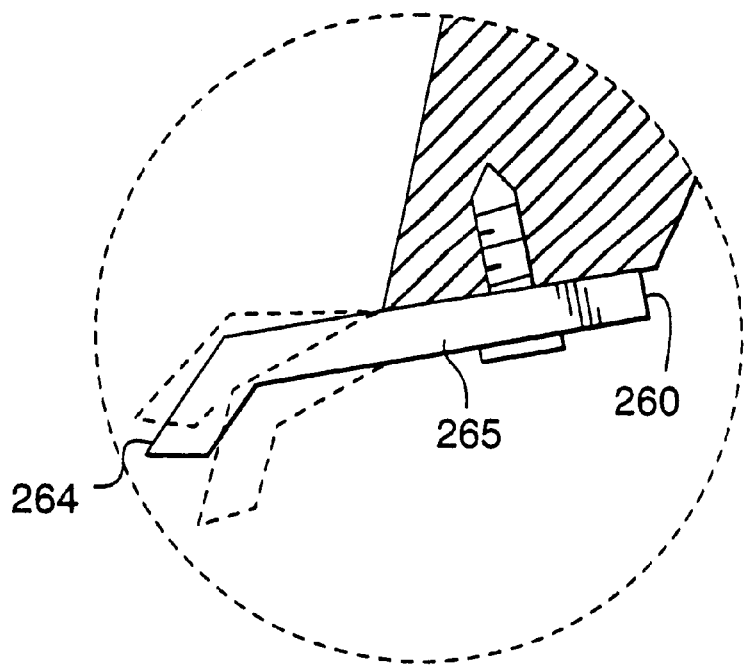
FIG. 15 is an exploded side view of one of the blades shown in FIG. 14.

Referring now to FIGS. 14 and 15, there is shown an alternative embodiment of compression head 200, which is substantially identical in structure and function to compression head 200 except that the blades 214 have been replaced with blades 260. Particularly, blades 260 are substantially identical in structure and function to blades 214 except that blades 260 include a flexible and selectively moveable projection portion 262 having a projecting stencil contacting edge or portion 264 which projects from body 265 and which orthogonally and sealingly contacts stencil 46. In one non-limiting embodiment, portion 264 orthogonally projects from body 265. Blade 260 provides for improved shearing of material 100 from stencil 46.

Figure 16:
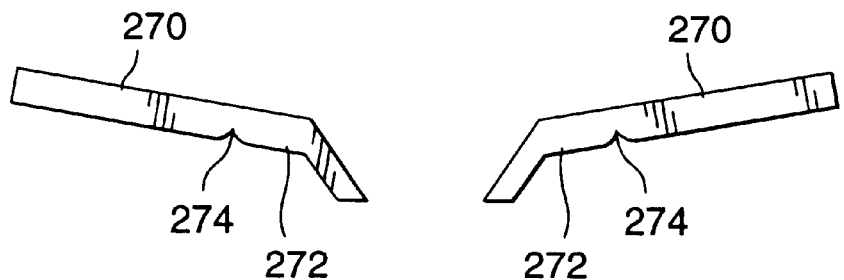
FIG. 16 is an unassembled side view of blades made in accordance with yet another yet alternate embodiment of the invention.
Figure 17:
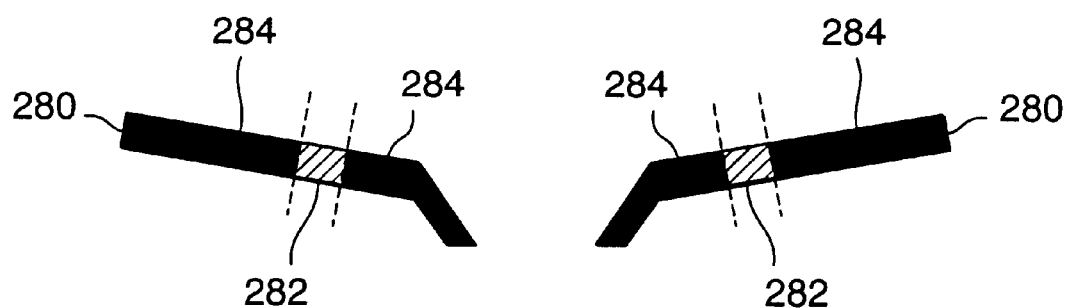
FIG. 17 is an unassembled side view of blades made in accordance with another alternative embodiment of the invention.
Figure 18:
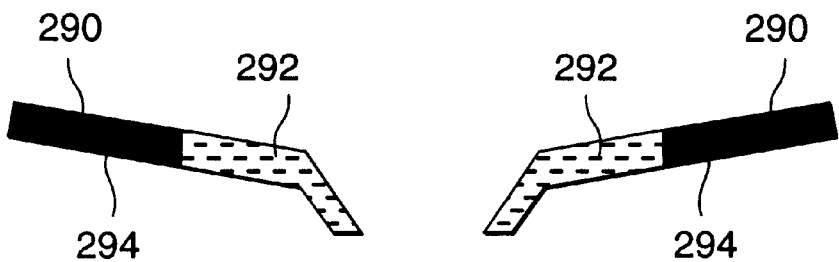
FIG. 18 is an unassembled side view of blades made in accordance with another alternate embodiment of the invention.

Referring now to FIGS. 16–18, there are illustrated several embodiments of blades for use with the present invention which are substantially identical to blades 260 with the exception of the following delineated characteristics.

Blades 270, illustrated in FIG. 16, each include a generally "V"-shaped notch 274 located on the bottom stencil contacting surface 272 of blades 270. Notch 274 increases the compliance and flexibility provided by the blades 270.

Blades 280, illustrated in FIG. 17, are each manufactured from two different polymeric materials by a conventional "two-shot" co-molding or forming process. Particularly, each blade 280 includes a relatively compliant central portion 282 which is made primarily of a relatively low modulus elastomeric polymer, and substantially similar and relatively rigid outer portions 284 which are made primarily of a relatively high modulus polymeric material or metal.

Blades 290, illustrated in FIG. 18, are each manufactured from two different metallic materials. Particularly, each blade 290 includes a relatively rigid projection portion 292 manufactured from a relatively stiff or rigid metal or composite material, and a relatively compliant securing portion 294, which is fixedly mounted to surface 216, which is manufactured from a relatively flexible metal or composite material, and which allows portion 292 to selectively move upwardly and downwardly with respect to surfaces 216, in the presence of pressure and/or stencil surface variations. Portions 292 and 294 are preferably coupled by a conventional method, such as by metal cladding, seam welding, or any other suitable and similar technique.

Figure 19:
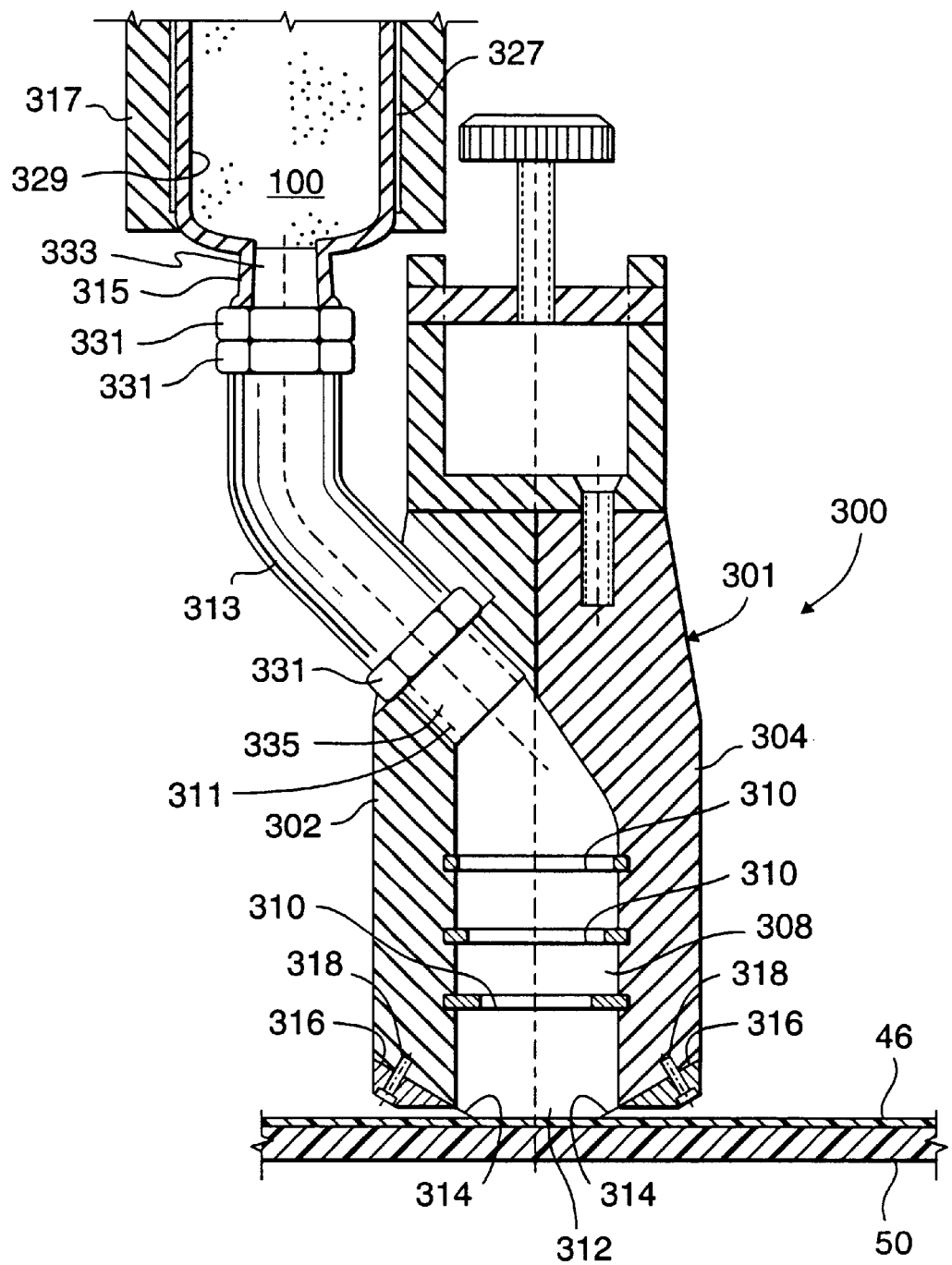
FIG. 19 is a sectional side view of an alternate embodiment of viscous material dispensing apparatus.
Figure 20:
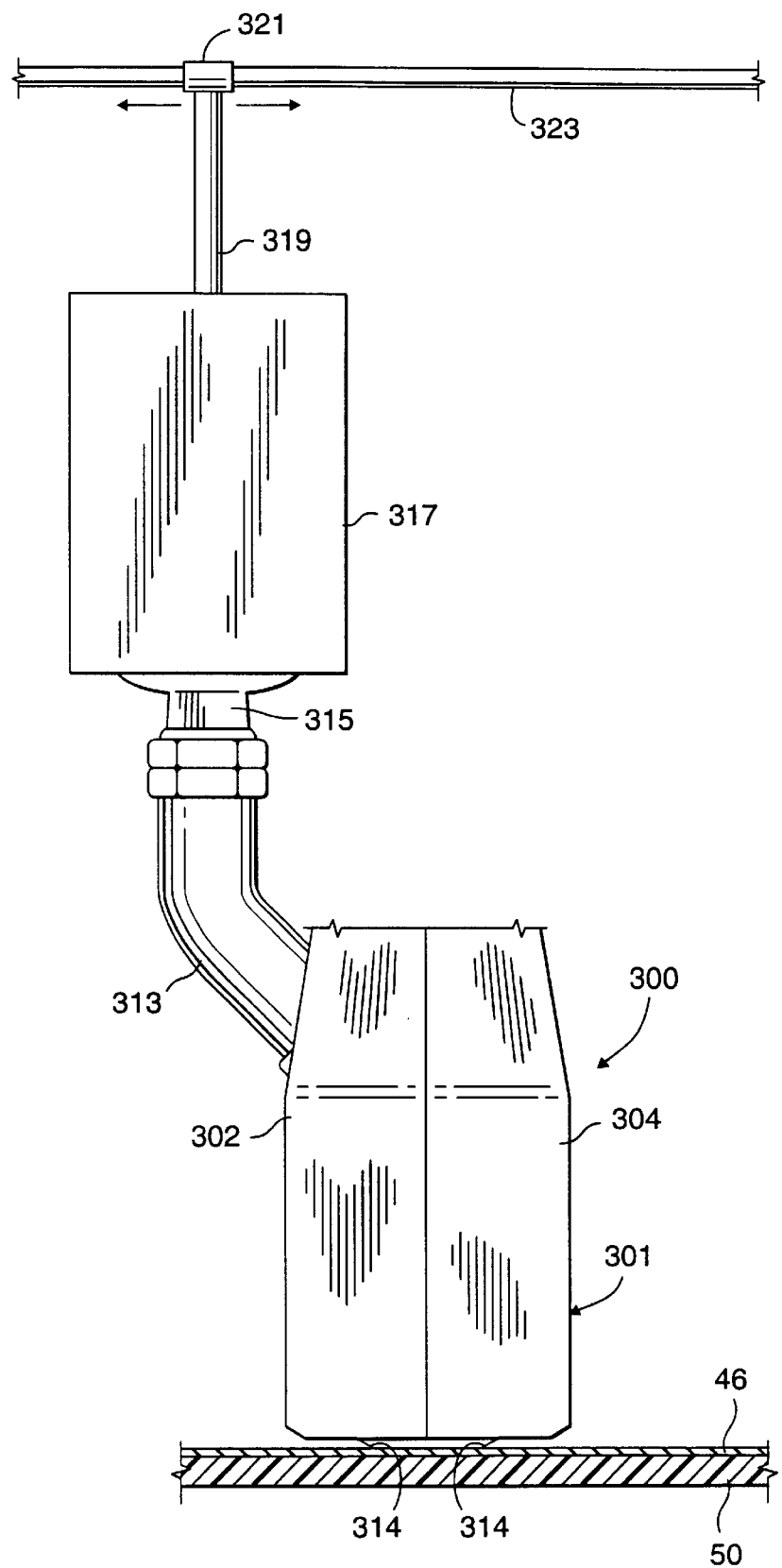
FIG. 20 is a side view of the viscous material apparatus shown in FIG. 19.

Referring now to FIGS. 19 and 20, there is shown an apparatus 300 which selectively dispenses viscous material and which is made in accordance with the teachings of a third embodiment of the invention.

Particularly, apparatus 300 includes a compression head 301 which includes substantially identical components as head 200. Unless otherwise specified below, components having a substantially identical structure and function are defined by the same reference numerals as those components of head 200 which was previously delineated in FIGS. 6 through 8, with the exception that these components will have reference numerals which are incremented by 100.

Apparatus 300 further includes a generally cylindrical paste or viscous material dispenser 317 having a vertically extending support member 319 which is selectively and movably connected to a support beam 323 by use of a conventional and commercially available attachment member 321. Particularly, member 321 moveably engages support beam 323 in a conventional manner, such as by the use of conventional bearings or rollers (not shown), and allows dispenser 317 to selectively move along beam 323. Support member 319, beam 323 and attachment member 321 cooperatively "hold" or position dispenser 317 at some predetermined distance above head 301 and allow dispenser 317 to be supported independently from head 301.

Dispenser 317 is a pneumatic, hydraulic, mechanical or electrical viscous material dispenser adapted to selectively provide a flow of viscous material 100 at a certain rate and pressure from a paste reservoir 327 to head 301. Reservoir 327 includes a generally cylindrical material containment portion 329 and a tubular shaped material dispensing portion 315.

A generally flexible tubular member 313 selectively permits the flow of viscous material 100 from reservoir 327 into compression head 301. Substantially identical communicating ends 333, 335 of member 313 are each respectively, selectively and communicatively secured within dispensing portion 315 and within aperture 311. Conventional fasteners 331 compressibly, sealably, and selectively secure ends 333, 335 within portion 315 and aperture 311, respectively.

In operation, head 301 is moved across stencil 46 and printed wiring board 50 in a conventional manner. As head 301 traverses stencil 46, reservoir 317 follows or "tracks" the movement of head 301. In one non-limiting embodiment, head 301 "pulls" reservoir 317 along its path of travel by way of tube 313. In a separate embodiment, reservoir 317 follows or "tracks" the movement of head 301 through a conventional external control methodology, such as by use of cables and/or by an electrical motor within movable attachment member 321. In another embodiment, tube 313 is elongated and has a length which is substantially equal to the maximum distance or "span" of travel of head 301, thereby allowing dispenser 317 to remain substantially stationary, as the head 301 selectively moves across the stencil.

It should be appreciated that the "off-loading" or independent support and travel of dispenser 317 and paste reservoir 327, provided by apparatus 300, enables the use of very large and heavy syringes and dispensing assemblies without the presence of the previously-delineated drawbacks related to weight applied to the compression head assembly.

It is to be understood that the embodiments of the invention which have been described are merely illustrative of some applications of the principles of the invention. Numerous modifications may be made by those skilled in the art without departing from the true spirit and scope of the invention.

What is claimed is:

1. An apparatus for directing the flow of viscous material to a stencil, said apparatus comprising:

a printer head selectively formed by two members which cooperatively define an internal chamber which terminates in a bottom surface and which selectively receives and dispenses said viscous material; and a pair of flexible self-compliant blades, which are longitudinally coextensive to and fixedly secured to said bottom surface, each of said blades including a body portion which is attached to said bottom surface and a stencil engaging portion which projects downward from said body portion and which includes a generally flat stencil contacting edge which is adapted to selectively engage said stencil, said blades being flexibly moveable across said stencil effective to spread said viscous material across said stencil.

2. The apparatus of claim 1 wherein said blades are made from a polymeric substance.

3. The apparatus of claim 1 wherein said stencil engaging portions of said blades are substantially and longitudinally coextensive with said blades, and substantially orthogonally project from said body portions of said blades.

4. The apparatus of claim 1 wherein each of said blades includes a substantially "V"-shaped notch which is formed in a bottom surface of each blade and which increases the compliance and flexibility of each blade.

5. A blade for use in combination with a print compression head adapted to selectively receive and distribute viscous material onto a stencil; said blade comprising:

a first portion which is adapted to be coupled to a bottom surface of said print compression head; and a second self-compliant portion which downwardly projects from said first portion, which includes a generally flat stencil contacting edge which selectively and sealingly engages said stencil.

6. A blade for use in combination with a print compression head adapted to receive and distribute viscous material onto a stencil, said stencil comprising:

a first portion having a plurality of apertures which are adapted to receive fasteners for coupling said blade to a bottom surface of said print compression head; and a second portion which is selectively moveable, which substantially orthogonally projects from said first portion, and which has a generally flat stencil engaging edge which selectively and sealingly engages said stencil.

7. The blade of claim 6 wherein said first portion and said second portion are manufactured from a relatively rigid material and wherein said blade further comprises a third portion which is disposed between said first portion and said second portion and which is manufactured from a relatively flexible material.

8. The blade of claim 6 wherein said second portion includes a substantially "V"-shaped notch which is formed in a bottom surface of said blade and which increases the compliance and flexibility of said blade.

9. The blade of claim 6 wherein said first portion and said second portion are manufactured from a polymeric material.

10. The blade of claim 6 wherein each of said first and said second portions are formed from metal.

11. The blade of claim 6 wherein said first portion is manufactured from a relatively flexible material and wherein said second portion is manufactured from a relatively rigid material.

* * * * *